(12) United States Patent
Piao

(10) Patent No.: US 6,458,686 B1
(45) Date of Patent: Oct. 1, 2002

(54) INVERSE INTEGRATED CIRCUIT FABRICATION PROCESS

(75) Inventor: Fan Piao, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,980

(22) Filed: Apr. 30, 2001

(51) Int. Cl.[7] .................................. H01L 21/4763

(52) U.S. Cl. .................. 438/622; 438/151; 257/758

(58) Field of Search ........................ 438/622, 118, 438/151, 152, 384; 257/758

(56) References Cited

U.S. PATENT DOCUMENTS 5,439,848 A * 8/1995 Hsu et al. .................. 438/151

* cited by examiner

Primary Examiner—David Nelms
Assistant Examiner—Andy Huynh
(74) Attorney, Agent, or Firm—Foley & Lardner

(57) ABSTRACT

An inverse IC process provides surface uniformity. A method of fabricating an integrated circuit structure includes a number of interconnect layers and a number of transistors. The method includes providing interconnect layers above a substrate, providing a semiconductor layer above the interconnect layers and providing gate conductors on a top surface of the semiconductor layer. The top surface is opposite a bottom surface. The bottom surface is closer to the interconnect layers than the top surface.

20 Claims, 5 Drawing Sheets

INVERSE INTEGRATED CIRCUIT FABRICATION PROCESS

FIELD OF THE INVENTION

The present application relates to an integrated circuit (IC) and fabrication of ICs. More particularly, the present application relates to a method of forming an integrated circuit with reduced topology complications and to the structure formed by such a method.

BACKGROUND OF THE INVENTION

The increased demand for higher performance integrated circuit (IC) devices has required a higher density of transistors and other components on the IC substrate. The increased density of components, in turn, has required an increased density of metalization lines on interconnect layers as well as an increase in the number of the interconnect layers. Metalization lines are also referred to as conductive lines, paths or traces. Interconnect layers or metal layers (metal 1, metal 2, metal 3, metal 4, metal 5, etc.) are typically comprised of conductive traces separate from each other by dielectric material.

Multilayer integrated circuit devices generally include several interconnect layers (metal layer 1, metal layer 2, metal layer 3, etc.) stacked upon each other. The interconnect layers are separated from each other by interlevel dielectric layers (ILD 1, ILD2, ILD3, etc.) The interlevel dielectric layers can be comprised of one or more insulative films sandwiched between interconnect layers. The interconnect layers are electrically coupled to each other by conductive vias or contacts which traverse the interlevel dielectric layer. The conductive vias can connect at least two conducting lines or paths in separate interconnect layers. Conductive lines in integrated circuit devices are generally thin layers (e.g., approximately 4,000 Angstroms (Å) thick) of aluminum (Al), Copper (Cu) or an alloy of Al and Cu.

The use of multiple interconnect layers can adversely affect the formation of integrated circuits. According to conventional integrated circuit process flow, transistors are manufactured on or within a semiconductor substrate and covered with an interlevel dielectric layer (ILD 0). The gates of the transistors typically extend above the top surface of the substrate. The insulative layer or interlevel dielectric layer is covered by an interconnect layer (metal 1), which is covered by another insulative layer (ILD 1) which is covered by another interconnect (metal layer 2) in subsequent process steps. These process steps can continue until five or more interconnect metal layers are provided.

The topology of a multilayer integrated circuit manufactured by this conventional process can be complicated. For example, surface uniformity is often adversely affected by the number of interlevel dielectric layers and interconnect layers. Further, the use of trenches within the substrate, within ILD layers and the metal layers can result in surface uniformity problems. Another source of surface non-uniformity is the use of gate structures which extend above the top surface of the substrate.

Complicated wafer surface topology can result in transfer overlay errors. Most conventional processes require a chemical mechanical polish between layering steps to ensure that a subject layer is flat (highly uniform at the surface) and planar enough to serve as a bottom layer for an additional layer. However, even the most diligent CMP processes on multilayer structures can result in topologies which reduce the overall accuracy of integrated circuit structures.

Thus, there is a need for a multilayer integrated circuit structure which is less susceptible to the harmful effects of complicated wafer surface topology. There is also a need for a method of manufacturing an integrated circuit with enhanced surface uniformity. Further still, there is a need for a process flow designed to reduce surface non-uniformities associated with interconnect layers.

SUMMARY OF THE INVENTION

An exemplary embodiment relates to a multilayer ultra-large scale integrated circuit structure. The multilayer ultra-large scale integrated circuit structure includes a substrate, a plurality of interconnect layers, a plurality of insulative layers, and a semiconductor film. The plurality of interconnect layers are disposed above the substrate. At least one of the insulative layers is between the plurality of interconnect layers. Interconnect vias are disposed through the insulating layers to electrically couple to at least one of the interconnect layers. The semiconductor film has a top surface and a bottom surface. The top surface includes a plurality of gate structures. The bottom surface is closer to the interconnect layers than the top surface. A conductive path extending from the top surface to the bottom surface is electrically coupled to at least one of the interconnect vias.

Another exemplary embodiment relates to a method of fabricating an integrated circuit (IC) structure. The integrated circuit structure includes interconnect layers and transistors. The method includes steps in the following order of: providing a first interconnect layer above a substrate, providing a first insulative layer above a first interconnect layer, providing a second interconnect layer above the first interconnect layer, and providing a second insulative layer above the second interconnect layer. The method also includes steps of providing a semiconductor film above the second insulative layer and providing the transistors at least partially in the semiconductor film. Surface topology uniformity is improved by the method.

Still another exemplary embodiment relates to an inverse integrated circuit process of fabricating a large scale integrated circuit structure. The large scale integrated circuit structure includes interconnect layers beneath a semiconductor layer and gate conductors at least partially above the semiconductor layer. The process includes providing the interconnect layers above a substrate, providing the semiconductor layer above the interconnect layers, and providing the gate conductors on a top surface of the semiconductor layer. The top surface is opposite a bottom surface. The bottom surface is closer to the interconnect layers than the top surface.

BRIEF DESCRIPTION OF THE DRAWINGS

Preferred embodiments of the invention will hereinafter be described in conjunction with the appended drawings, wherein like numerals denote like elements, and.

DETAILED DESCRIPTION OF PREFERRED EXEMPLARY EMBODIMENTS

Figure 1:
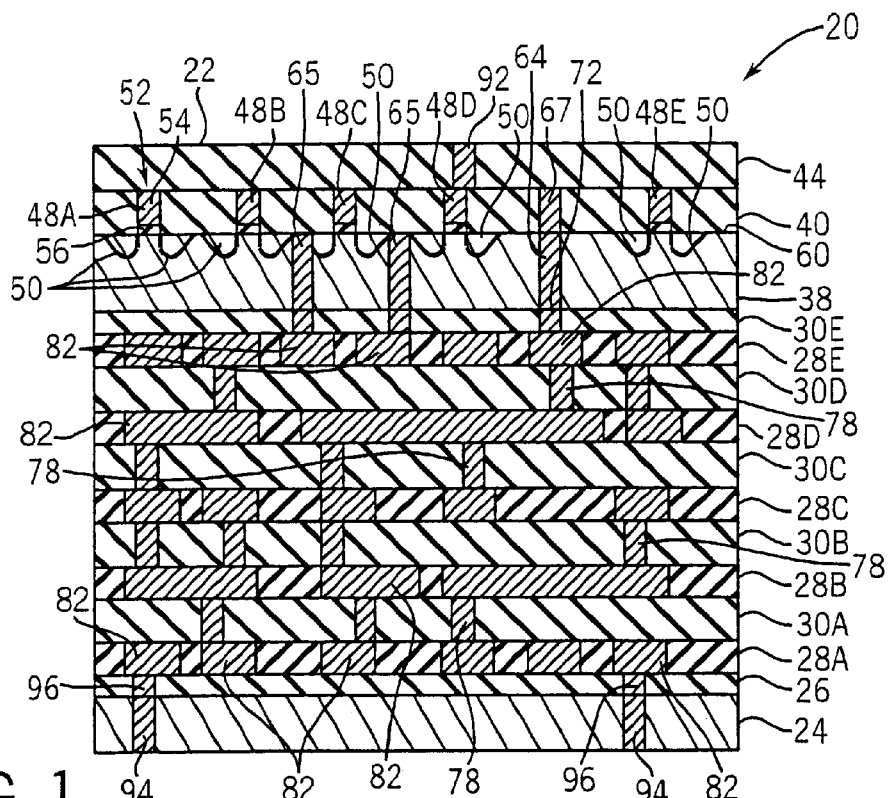
FIG. 1 is a schematic cross-sectional view of a multilayer integrated circuit structure including interconnect layers underneath a semiconductor layer in accordance with an exemplary embodiment.

With reference to FIG. 1, a portion 20 of a multilayer integrated circuit (IC) structure includes a top surface 22 which advantageously has superior surface uniformity. Unlike conventional multilayer circuit structures which include numerous interconnect layers situated above transistors on a substrate, thereby contributing to unevenness or non-uniformity upon the wafer surface, portion 20 utilizes a set of interconnect layers beneath the transistors. In this way, the interconnect layers can be formed more accurately and with less complications.

Portion 20 of multilayer structure includes a base or substrate 24, an insulative layer 26, an interconnect layer 28A, an insulative layer 30A, an interconnect layer 28B, an insulative layer 30B, an interconnect layer 28C, an insulative layer 30C, an interconnect layer 28D, an insulative layer 30D, an interconnect layer 28E, an insulative layer 30E, a semiconductor film or layer 38, an insulative layer 40, and an insulative layer 44 associated with top surface 22. Interconnect layers 28A–E (metal layers 1–5) are separated by insulative layers 30A–D (interlevel dielectric layers (ILD) 1–4), respectively.

Semiconductor layer 38 includes a multitude of transistors such as transistors 48A–E. Each of transistors 48A–E includes source and drain regions 50 and gate structures 52. Gate structures 52 can be at least partially disposed above a top surface 60 of semiconductor layer 38. Gate structures 52 can be comprised of a polysilicon gate conductor 54 and a gate dielectric layer 56.

Portion 20 of the multilayer integrated circuit substrate can be manufactured as an integrated circuit wafer and be comprised of various conductive, semiconductive and insulative materials. Preferably, portion 20 is part of an ultralarge scale integrated circuit that includes one million or more transistors, such as, transistors 48A–D. For example, transistors 48A–D can be embodied as metal oxide semiconductor field effect transistors (MOSFETS), insulated gate field effect transistors (IGFETs), diodes, bipolar transistors, or other integrated circuit devices or structures. The types of materials and types of devices associated with portion 20 are not discussed below in a limiting fashion.

A conductive path such as a conductive via 64 can be provided from top surface 60 of semiconductor layer 38 to a bottom surface 66 of semiconductor layer 38. Another conductive path such as conductive via 65 can be provided from top surface 60 of layer 38 to bottom surface 66. Conductive vias 64 and 65 can be coupled to a gate conductor, a local interconnect, or other integrated circuit structure associated with top surface 60 of semiconductor layer 38. Via 64 can be in contact with interconnect layer 28E through insulative layer 30E. A conductive via 72 can be provided in insulative layer 30E to provide a path from surface 66 of layer 38 to conductive line 92 and interconnect layer 28E. Therefore, devices associated with layer 40 (transistors 48A–E) can be coupled through layer 38 to interconnect layers 28A–E through vias 64 and 72.

Interconnect layers 28A–E each include conductive lines, such as lines 82. Lines 82 can be disposed in a variety of fashions according to integrated circuit design criteria. According to one exemplary design rule, conductive lines 82 associated with layer 28A are provided in generally parallel fashion into and out of the page associated with FIG. 1. Conductive lines 82 associated with interconnect layer 28B are provided in a parallel fashion at an orientation 90 degrees from lines 82 of interconnect layer 28A. Conductive lines 82 associated with layers 28C–E are also provided in either parallel or perpendicular fashion. Vias 78 in insulative layers 30A–E connect selected conductive lines 82 to other selected conductive lines 82 and other interconnect layers 28A–E.

Insulative layers 30A–D include conductive vias 78 for connecting interconnect layers 28A–E. Therefore, signals from layer 38 (e.g. transistors 48A–D) can reach any conductive line 92 in any of layers 28A–E through vias 64, 65, 72 and 78.

Vias 64, 65, 72 and 78 can be a variety of materials. For example, vias 64, 65, 72 and 78 can be metal vias such as tungsten, copper, titanium, or other conductive materials. In another alternative embodiment, vias 64, 65, 72, and 78 can be polysilicon (e.g., heavily doped). Vias 64, 65, 72 and 94 include silicided portions. The dimensions and placement of vias 78 are not shown in a limiting fashion. Exemplary sizes of vias 64, 65, 72, and 78 are 300 nm. Design criteria and system parameters for portion 20 can effect the size and shape of vias 64, 65, 72, and 78.

In a preferred embodiment, conductive vias 65 connect a shared source region associated with neighboring transistors 48C and 48D and a shared drain region associated with neighboring transistors 48B and 48C. Conductive vias 72 are coupled to conductive vias 65 and provide a direct connection to respective conductive lines 82 of layer 28E.

Conductive via 64 can be coupled to a gate conductor, local interconnect, or other structure such as structure 67. For example, structure 67 can be associated with a gate conductive line, a local interconnect or other device. As shown in FIG. 1, conductive via 64 connects structure 67 to conductive line 82 in layer 28E through conductive vias 64 and 72.

A conductive via 92 can also be provided through an insulative layer 44 above transistors 48A–E. An integrated circuit package can be utilized to connect conductive via 92 to a conductive via 94 through base layer 24 and a conductive via 96 through insulative layer 26. In this way, via 92 can be coupled to layers 28A–E through an off-chip connection. However, these connections typically require higher resistance and longer circuit paths. Vias 94 and 92 can also be utilized to provide connections to pins associated with the integrated circuit package.

According to an exemplary embodiment, portion 20 utilizes vias 64 and 65 through semiconductor layer 38 to provide connections between interconnect layers 28A–E and transistors 48A–E.

Figure 2:
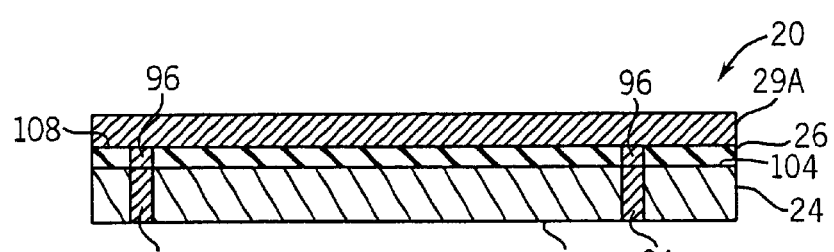
FIG. 2 is a schematic cross-sectional view of the multilayer integrated circuit illustrated in FIG. 1, showing a first insulative layer deposition step and a first conductive layer deposition step.

The fabrication of portion 20 is discussed below with reference to FIGS. 2–12. With reference to FIG. 2, substrate 24 can be any type of base layer or integrated circuit fabrication. For example, substrate 24 can be a semiconductor wafer, a silicon-on-insulator wafer, a plastic substrate or other material. Substrate 24 can be provided with conductive vias 94 extending from a top surface 104 of substrate 24 to a bottom surface 106 of substrate 24. Substrate 24 can be 1000 Å thick. An insulative layer 26 can be deposited on top of top surface 104 of substrate 24. Insulative layer 26 is preferably a tetraethylorthosilicate (TEOS) deposited layer of silicon dioxide material. Preferably, layer 26 is 4,000–6,000 Å thick.

Alternatively, insulative layer 26 can be grown or deposited by other chemical vapor deposition (CVD) processes. After deposition of layer 26, vias 96 can be provided. For example, vias 96 can be provided in a conventional process in which layer 26 is etched to form apertures which are filled with conductive material, such as a metal material. After filling, the metal outside of the aperture is removed according to an etching or polishing process. Further, a top surface 108 of layer 26 is polished according to a chemical mechanical polish (CMP process).

Alternatively, layer 26 can be a plasma enhanced chemical vapor deposition (PECVD) TEOS oxide or a SiH$_4$-based PECVD oxide which is blanket deposited on substrate 24. The aperture for via 96 can be dry etched into layer 26. Via 96 can be formed in a process similar to the process of forming via 94.

After layer 26 is polished, a conductive layer 29A is deposited on layer 26. Layer 29A can be deposited by physical vapor deposition (PVD), sputter deposition, collimated sputtering deposition, dipping, evaporating, or other application technique. Preferably, layer 29A is approximately 4000–6000 Å thick and is a composite of several metal layers. For example, layer 29A can include a 250 Å thick bottom layer of titanium, a 4000 Å thick layer of aluminum including copper, and a top barrier layer of titanium nitride. The top barrier layer can be 1,100 Å thick. Alternative compositions can be utilized for layer 29A.

Figure 3:
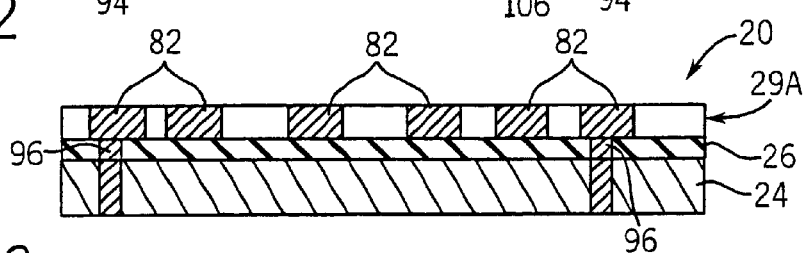
FIG. 3 is a schematic cross-sectional view of the multilayer integrated circuit illustrated in FIG. 1, showing a conductive layer etching step.

With reference to FIG. 3, layer 29A can be masked and etched to form conductive lines 82. Preferably, 29A is selectively etched in accordance with a photoresist mask by a plasma etching technique to form a conductive pattern. The conductive pattern can include conductive lines 82. Alternatively, the conductive pattern for layer 29A can be formed by a wet etching or other removal process.

Figure 4:
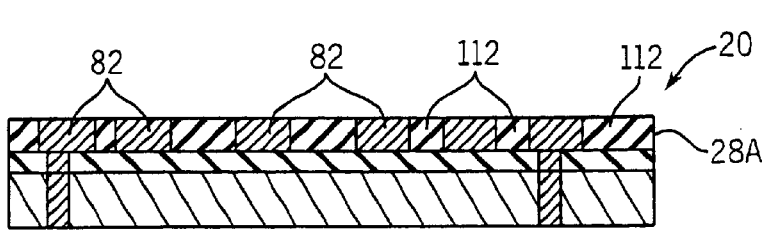
FIG. 4 is a schematic cross-sectional view of the multilayer integrated circuit illustrated in FIG. 1, showing a second insulative layer deposition step and a chemical mechanical polish step to complete a first interconnect layer.

With reference to FIG. 4, after the pattern associated with conductive lines 82 is formed, an insulative material 112 is provided between conductive lines 82 to form interconnect layer 28A. Material 112 is preferably deposited as thick insulative material (e.g., a 2.0 micron or greater layer). The layer can be deposited by PECVD TEOS on top of conductive lines 82. After deposition, the layer is polished by CMP (etched back to approximately 1.4 to 1.6 microns) to leave material 112 which is planarized (e.g., flushed with filled spaces between conductive lines 82).

Figure 5:
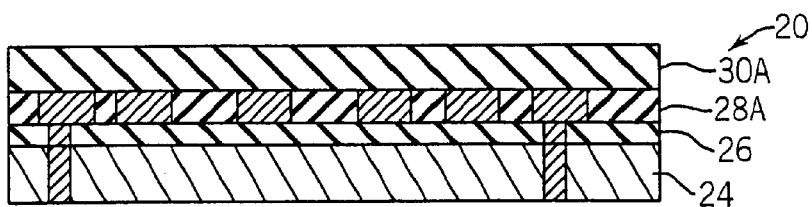
FIG. 5 is a schematic cross-sectional view of the multilayer integrated circuit structure illustrated in FIG. 1, showing a third insulative layer deposition step.
Figure 6:
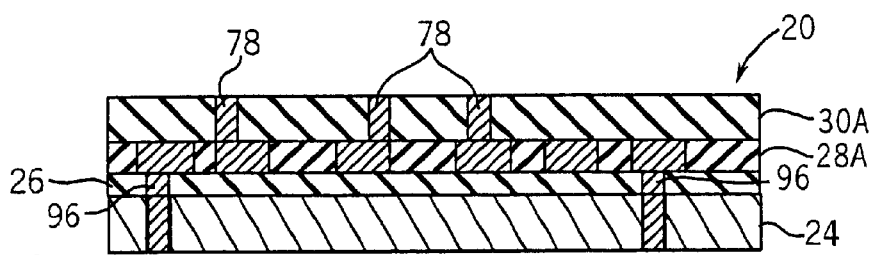
FIG. 6 is a schematic cross-sectional view of the multilayer integrated circuit structure illustrated in FIG. 1, showing a first conductive via formation step.

With reference to FIG. 5, after interconnect layer 28A is formed, a 4000–6000 Å thick insulative layer 30A is provided above interconnect layer 28A. Layer 30A can be similar to layer 26 and can be a TEOS deposited silicon dioxide layer. After deposition, layer 30A is polished by CMP. With reference to FIG. 6, vias 78 are formed in layer 30A in a process similar to the formation of vias 96 discussed above with reference to FIG. 2.

Figure 7:
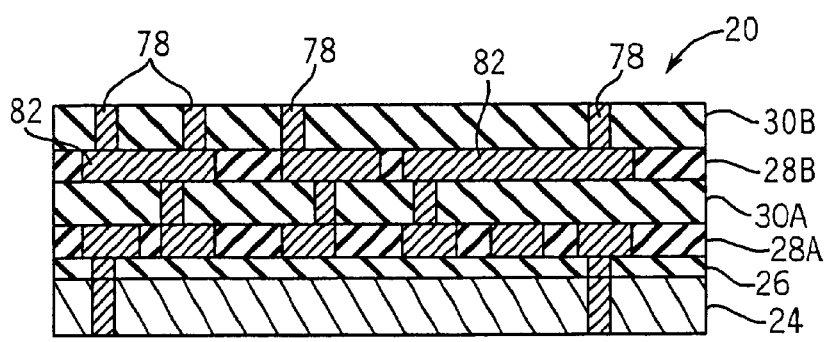
FIG. 7 is a cross-sectional view of the multilayer integrated circuit structure of FIG. 1, showing a second interconnect layer formation step, a fourth insulative layer deposition step, and a second conductive via formation step.
Figure 8:
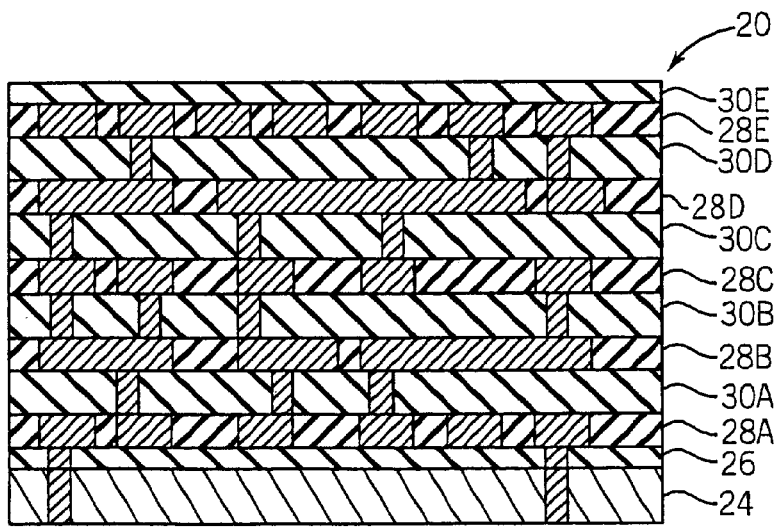
FIG. 8 is a cross-sectional view of the integrated circuit structure illustrated in FIG. 1, showing a third interconnect layer formation step, a fifth insulative layer deposition step, a third conductive via formation step, a fourth interconnect layer formation step, a sixth insulative layer deposition step, a fourth conductive via formation step, a fifth interconnect layer formation step, and a seventh insulative layer deposition step.

With reference to FIG. 7, interconnect layer 28B and insulative layer 30B are provided in a process similar to the process utilized to provide layers 28A and 30A. Interconnect layer 28B includes conductive lines 82 and insulative layer 30B includes vias 78. With reference to FIG. 8, interconnect layers 28C–E and insulative layers 30C–D are provided in a process similar to the process described below with reference to FIGS. 2–7. An insulative layer 30E is provided on top of interconnect layer 28E. Layer 30E can be provided in a process similar to the provision of layer 26 or 30A.

Figure 9:
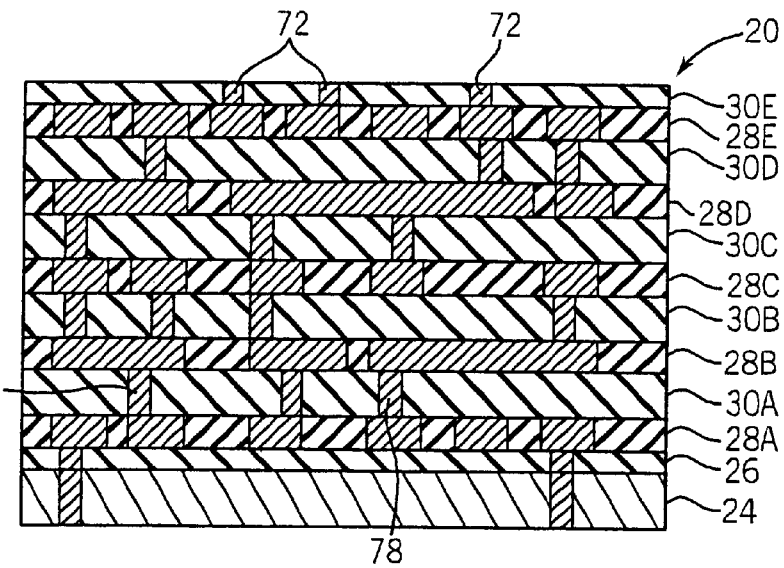
FIG. 9 is a schematic cross-sectional view of the multilayer integrated circuit structure illustrated in FIG. 1, showing a fifth conductive via formation step.

With reference to FIG. 9, conductive vias 72 are provided in layer 30E. Vias 72 can be formed in a process similar to the process utilized to form vias 78. Vias 72 are provided for conductive paths within layer 38 (FIG. 1). After the provision of conductive vias 72, layer 30E is polished by CMP. Layer 38 can be any material appropriate for forming semiconductive devices.

Figure 10:
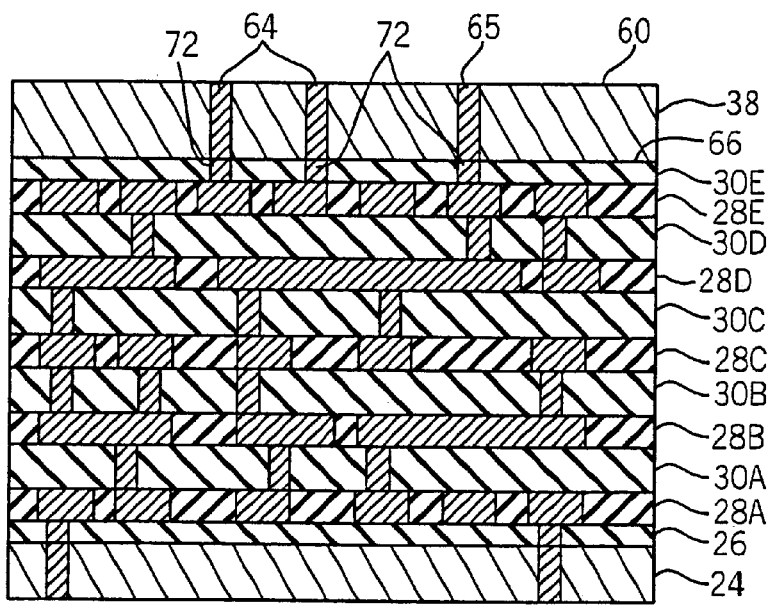
FIG. 10 is a schematic cross-sectional view of the multilayer integrated circuit structure illustrated in FIG. 1, showing a semiconductor film deposition step and a semiconductor via formation step.

With reference to FIG. 10, semiconductor layer 38 can be a single crystal silicon layer, a polycrystalline silicon layer, a gallium arsenide layer (GaAs), or other semiconductive material. Preferably, layer 38 is epitaxially deposited as a 100 Å thick silicon layer.

Layer 38 can be etched in accordance with a photoresist mask to form apertures associated with conductive vias 64 and 65. Preferably, conductive vias 64 and 65 are 3000 Å wide and extend from a top surface 60 to a bottom surface 66 of layer 38. The apertures for vias 64 and 65 can be formed in a dry etching process. Alternatively, other removal processes can be utilized. After the apertures are formed, the apertures are filled with a conductive material, such as tungsten, titanium, copper, aluminum or other metal to form conductive vias 64 and 65. After vias 64 and 65 are formed, layer 38 is planarized.

Figure 11:
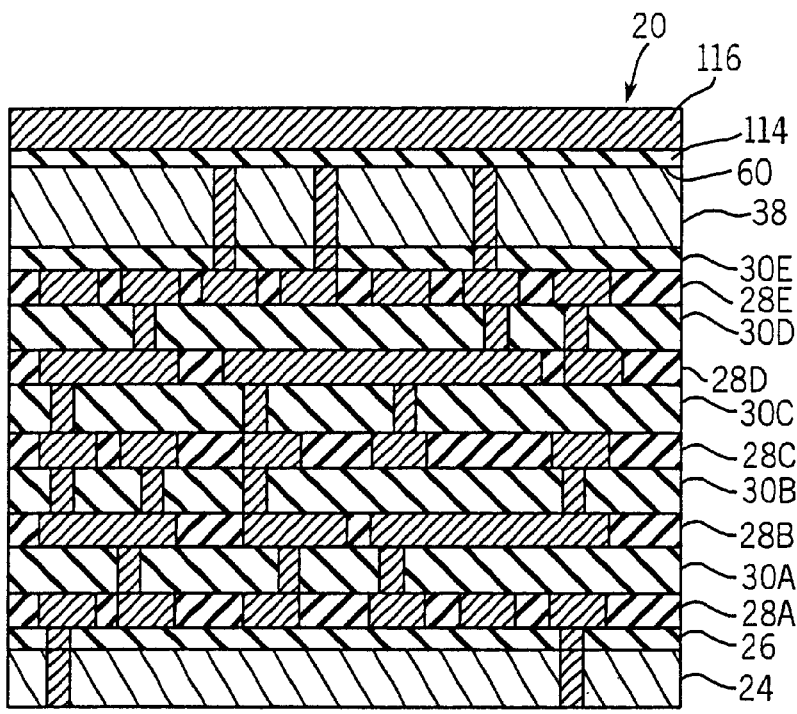
FIG. 11 is a schematic cross-sectional view of the multilayer integrated circuit structure illustrated in FIG. 1, showing a gate dielectric layer deposition step and a polysilicon layer deposition step.

With reference to FIG. 11, a gate dielectric layer 114 is provided on surface 60 of layer 38. Layer 114 can be approximately 20–50 Å thick. Layer 114 can be thermally grown or deposited. Exemplary materials for layer 114 include silicon dioxide and silicon nitride. After layer 114 is deposited, a polysilicon layer 116 is provided above layer 114. Layer 116 can be approximately 1200–1500 Å thick and deposited by chemical vapor deposition (CVD). Layer 116 can be doped as deposited (N+ or P+) or can be doped in subsequent processes.

Figure 12:
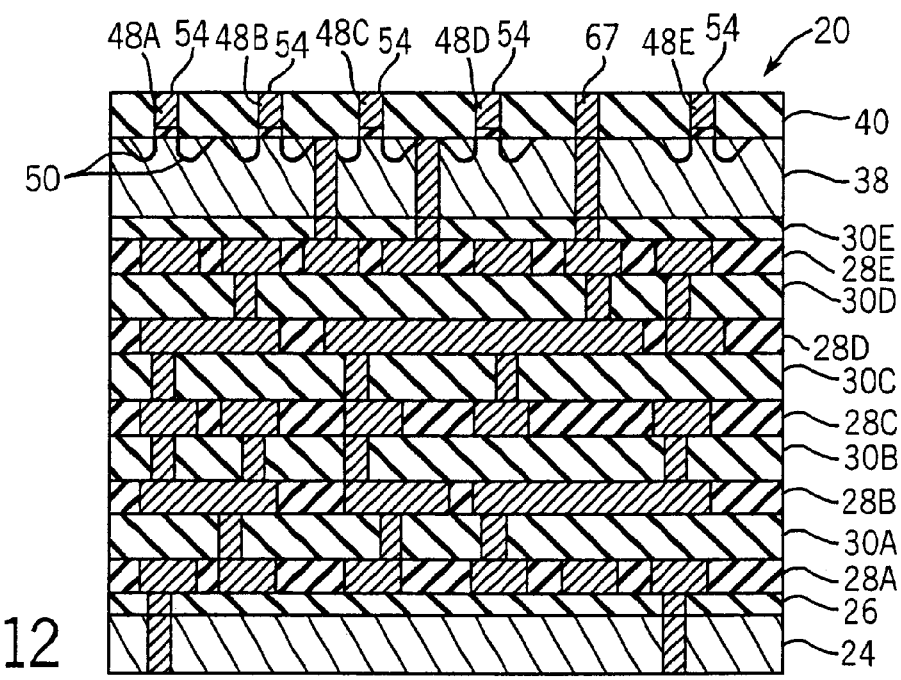
FIG. 12 is a schematic cross-sectional view of the multilayer integrated circuit structure illustrated in FIG. 1, showing a transistor formation step and an eighth insulative layer deposition step.

With reference to FIG. 12, layers 116 and 114 are selectively etched in accordance with a photoresist pattern to form gate structures 54. To form structure 67 discussed with reference to FIG. 1, layer 114 can be removed at that location before layer 116 is deposited (FIG. 11). Therefore, layer 116 is provided directly on top of layer 38 at the location of structure 67 (FIG. 1).

After structures 54 are formed, regions 50 can be formed in layer 38. Any suitable process for forming regions in various shapes can be utilized. For example, lighted doped drain (LDD) techniques can be utilized to form regions 50. After doping, insulative layer 40 is provided over transistors 48A–E and structure 67. Layer 40 can be deposited similar to layer 30A and subjected to a CMP process.

With reference to FIG. 1, layer 44 is deposited similar to layer 40. Layer 44 can be etched to provide an aperture for via 92. Via 92 can be formed in a process similar to the formation of via 96 and via 78. In one embodiment, via 92 is in contact with a gate conductor associated with transistor 48D.

Figure 13:
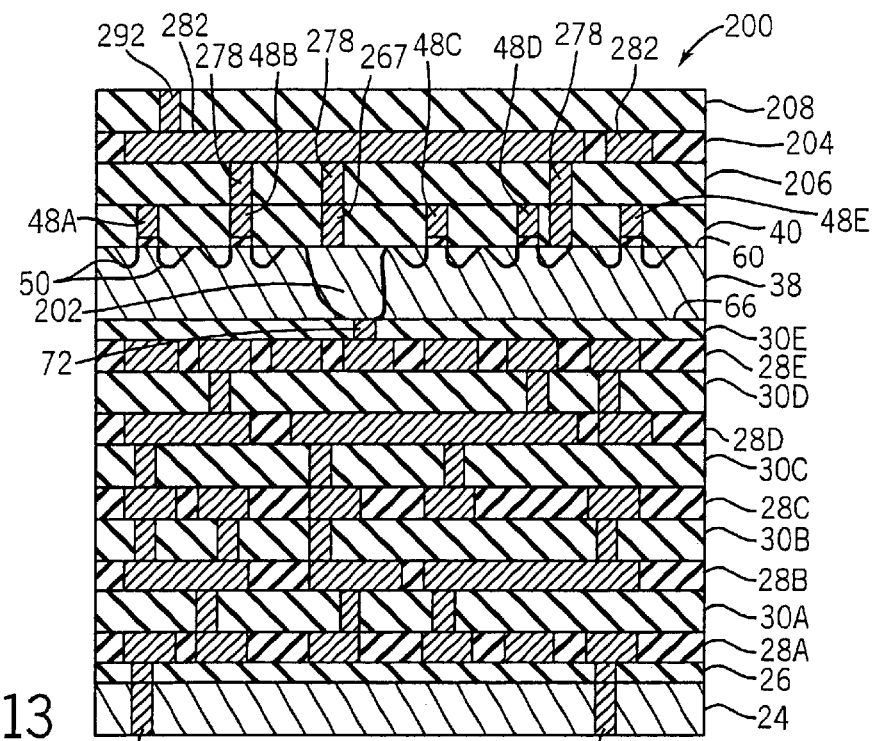
FIG. 13 is a schematic cross-sectional view of a multilayer integrated circuit structure in accordance with another exemplary embodiment, the multilayer integrated circuit structure includes a doped region as a conductive path between a semiconductor layer and interconnect layers.

With reference to FIG. 13, a portion 200 of a multilayer semiconductor structure is substantially similar to portion 20 discussed with reference to FIGS. 1–12. Portion 200 can be manufactured according to a similar process as portion 20. However, portion 200 includes a conductive path such as a doped region 202 from a top surface 60 to a bottom surface 66 of layer 38.

Layer 38 can also include conductive vias similar to vias 64 and 65 discussed with reference to FIG. 1. Doped region 202 is preferably doped with conventional semiconductor dopants. In one embodiment, region 202 can be a heavily doped region (N+ or P+ dopant) for providing electrical connection to a via 72 in layer 30E.

According to another alternative, layer 38 can include multiple conductive paths similar to doped region 202. According to one embodiment, a doped region such as region 202 can be coupled to a structure 267 similar to structure 67 discussed with reference to FIG. 1. In another alternative, a conductive path, such as region 202, can be coupled to drain and source regions 50 of transistors 48A–E.

In addition, portion 200 includes an interconnect layer 204 provided above layer 40 and an insulative layer 206. Layer 204 includes conductive lines 282 which are coupled to vias 278 in layer 40. Vias 278 can be coupled to drain and source regions 50, structure 267 and gates associated with transistors 48A–E. An insulative layer 208 can include a via 292 similar to via 92 for coupling to vias 94 or other off-chip elements.

Figure 14:
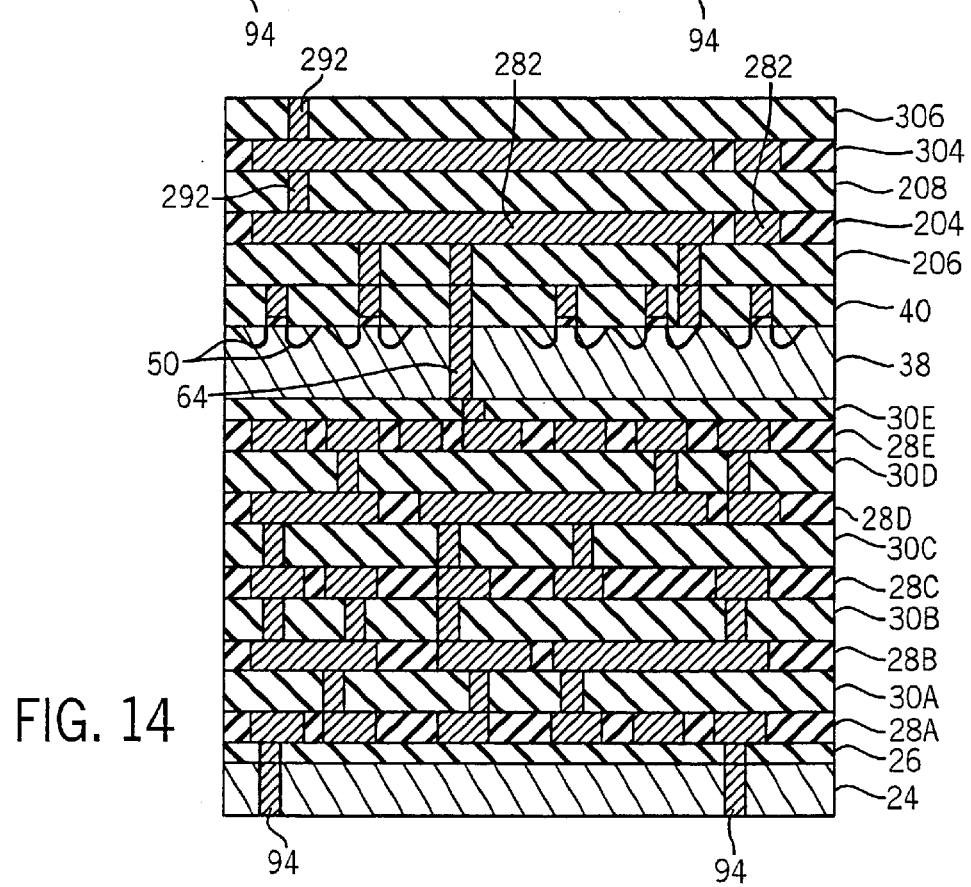
FIG. 14 is a schematic cross-sectional view of a multilayer integrated circuit structure including two interconnect layers above the semiconductor layer in accordance with yet another exemplary embodiment.

With reference to FIG. 14, a portion 300 of a multilayer integrated circuit structure includes a second interconnect layer 304 and a second insulative layer 306. Layers 304 and 306 are formed similarly to layers 204 and 208 discussed with reference to FIG. 13.

It is understood that, while the detailed drawings and specific examples given describe preferred exemplary embodiments of the present invention, they are for the purposes of illustration only. The present invention is not limited to the precise details, methods and conditions disclosed. For example, although dry etching is suggested, material may be removed in other processes. Further still, the conductive vias can be rectangular or circular in shape.

The dimensions, sizes, thicknesses and shapes are given in an exemplary fashion. For example, the various layers and lines may have different thicknesses and geometries, depending on integrated circuit designs and process technologies.

We claim:

1. A method of fabricating an integrated circuit structure including a plurality of interconnect layers, and a plurality of transistors, the method comprising steps in the following order:

providing a first interconnect layer above a substrate;

providing a first insulative layer above the first interconnect layer;

providing a second interconnect layer above the first interconnect layer;

providing a second insulative layer over the second interconnect layer;

providing a semiconductor film above the second insulative layer; and providing the transistors at least partially in the semiconductor film, whereby surface topology uniformity is improved.

2. The method of claim 1, further comprising:

forming a conductive path from a top surface of the semiconductor film to a bottom surface of the semiconductive film before or after the providing the transistors step.

3. The method of claim 2, wherein the conductive path is coupled to the second interconnect layer.

4. The method of claim 1 further comprising:

providing a third interconnect layer above the first insulative layer; and providing a third insulative layer above the third interconnect layer.

5. The method of claim 4 further comprising:

providing a fourth interconnect layer above the third insulative layer; and providing a fourth insulative layer above the fourth interconnect layer.

6. The method of claim 5 further comprising:

providing a fifth interconnect layer above the semiconductor layer; and providing a fifth insulative layer above the fifth interconnect layer.

7. The method of claim 2, wherein the conductive path includes a metal via.

8. The method of claim 7, wherein the via extends from a gate conductor to the second interconnect layer.

9. An inverse integrated circuit process of fabricating a large scale integrated circuit structure including a plurality of interconnect layers beneath a semiconductor layer and a plurality of gate conductors at least partially above the semiconductor layer, the process comprising:

providing the interconnect layers above a substrate;

providing the semiconductor layer above the interconnect layers; and providing the gate conductors on a top surface of the semiconductor layer, the top surface being opposite a bottom surface, the bottom surface being closer to the interconnect layers than the top surface.

10. The process of claim 9 further comprising:

providing an insulative layer over the gate conductors.

11. The process of claim 10 further comprising:

providing an interconnect layer above the insulative layer.

12. The process of claim 9 further comprising:
   providing a conductive path from the top surface to the bottom surface.

13. A method of manufacturing multilayer ultra-large scale integrated circuit structure comprising a substrate, a plurality of interconnect layers disposed above the substrate, a plurality of insulative layers, at least one of the insulative layers being between the interconnect layers, wherein interconnect vias are disposed through the insulating layers to be electrically coupled to at least one of the interconnect layers, and a semiconductor film having a top surface and a bottom surface, the top surface including a plurality of gate structures, the bottom surface being closer to the interconnect layers than the top surface, wherein a film conductive path extends from the top surface to the bottom surface, the film conductive path being electrically coupled to at least one of the interconnect vias, the method of manufacturing comprising the steps of:
   providing a first interconnect layer of the interconnect layers above the substrate;
   providing a first insulative layer of the insulating layers above the first interconnect layer;
   providing a second interconnect layer of the interconnect layers above the first interconnect layer;
   providing a second insulative layer of the insulating layers over the second interconnect layer;
   providing the semiconductor film above the second insulative layer; and
   providing the transistors at least partially disposed in the semiconductor film, the transistors including the gate structures whereby surface topology uniformity is improved.

14. The method of claim 13, wherein the conductive path is a doped region.

15. The integrated circuit of claim 14, wherein the conductive path is a P+ or N+ region.

16. The integrated circuit of claim 13, wherein the conductive path is a conductive substrate via.

17. The integrated circuit of claim 16, wherein the conductive substrate via includes a metal.

18. The integrated circuit of claim 17, wherein the metal includes tungsten, copper, or aluminum.

19. The integrated circuit of claim 13, further comprising:
   a top interconnect layer above the top surface of the film.

20. The integrated circuit of claim 19, wherein the top interconnect layer is coupled to the gate structures.

* * * * *